United States Patent
Iwasaki et al.

(10) Patent No.: US 10,641,272 B2
(45) Date of Patent: May 5, 2020

(54) VACUUM PUMP WITH ABATEMENT FUNCTION

(71) Applicant: EBARA CORPORATION, Tokyo (JP)

(72) Inventors: Koichi Iwasaki, Tokyo (JP); Hiroki Furuta, Tokyo (JP); Keiichi Ishikawa, Tokyo (JP); Tetsuo Komai, Tokyo (JP); Shinichi Sekiguchi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 203 days.

(21) Appl. No.: 14/644,135

(22) Filed: Mar. 10, 2015

(65) Prior Publication Data
US 2015/0260192 A1  Sep. 17, 2015

(30) Foreign Application Priority Data

Mar. 17, 2014 (JP) ................................ 2014-054128
Dec. 23, 2014 (JP) ................................ 2014-259614

(51) Int. Cl.
*F04D 19/04* (2006.01)
*B01D 53/86* (2006.01)
(Continued)

(52) U.S. Cl.
CPC ........... *F04D 19/04* (2013.01); *B01D 53/005* (2013.01); *B01D 53/323* (2013.01);
(Continued)

(58) Field of Classification Search
CPC .......... B01D 2251/30; B01D 2252/103; B01D 2253/102; B01D 2253/108;
(Continued)

(56) References Cited

U.S. PATENT DOCUMENTS 5,131,825 A * 7/1992 Bachmann ............. B01D 53/04
                                                         417/243
5,173,041 A * 12/1992 Niimura ................ F04C 23/001
                                                         417/313
(Continued)

FOREIGN PATENT DOCUMENTS

EP       0476631 A1    3/1992
EP       0821995 A1    2/1998
(Continued)

OTHER PUBLICATIONS

European Patent Application No. 15000767.2; Extended Search Report; dated Aug. 31, 2015; 8 pages.

*Primary Examiner* — Patrick Hamo
*Assistant Examiner* — Chirag Jariwala
(74) *Attorney, Agent, or Firm* — BakerHostetler

(57) ABSTRACT

A vacuum pump with abatement function which can prevent contamination of a process chamber without allowing products generated by exhaust gas treatment to flow back to the process chamber, and can reduce the amount of gas to be treated without allowing a purge gas and a diluent gas to be contained in an exhaust gas, and thus can achieve energy saving by reducing the amount of energy required for the exhaust gas treatment in an abatement part is disclosed. The vacuum pump with abatement function includes a vacuum pump to which at least one abatement part for treating an exhaust gas is attached. The vacuum pump comprises a dry vacuum pump having a pair of multistage pump rotors each of which comprises a plurality of rotors arranged on a rotating shaft, and the at least one abatement part is connected to an interstage of the multistage pump rotors.

16 Claims, 11 Drawing Sheets

(51) Int. Cl.
  *C23C 16/44* (2006.01)
  *B01D 53/00* (2006.01)
  *B01D 53/32* (2006.01)

(52) U.S. Cl.
  CPC ..... *B01D 53/8659* (2013.01); *B01D 53/8662* (2013.01); *B01D 53/8671* (2013.01); *C23C 16/4412* (2013.01); *B01D 2257/2025* (2013.01); *B01D 2257/2027* (2013.01); *B01D 2257/2045* (2013.01); *B01D 2257/2047* (2013.01); *B01D 2257/2064* (2013.01); *B01D 2257/2066* (2013.01); *B01D 2257/553* (2013.01); *B01D 2258/0216* (2013.01); *F05D 2260/607* (2013.01); *Y02C 20/30* (2013.01); *Y02P 70/605* (2015.11)

(58) Field of Classification Search
  CPC ...... B01D 2253/1124; B01D 2253/206; B01D 2255/10; B01D 2257/2025; B01D 2257/204; B01D 2257/2042; B01D 2257/2045; B01D 2257/553; B01D 2257/556; B01D 2258/0216; B01D 2259/818; B01D 53/0438; B01D 53/685; B01D 53/70; B01D 53/8659; B01D 53/8662; B01D 53/005; B01D 53/323; B01D 53/8671; B01D 2257/2027; B01D 2257/2047; B01D 2257/2064; B01D 2257/2066; B01D 53/26; B01D 53/32; B01D 53/86; F04B 37/06; F04B 37/14; F04B 39/00; F04D 19/04; F04D 19/042; C23C 16/4412; Y02C 20/30; Y02P 70/605; F05D 2260/607; F04C 11/001–003; F04C 25/02; F04C 23/001–003; F04C 18/08; F04C 18/082; F04C 18/126; F04C 18/16; F04C 15/00962; F04C 29/04; F04C 2220/10–12; F04C 29/00; F23G 7/06
  USPC ................ 418/9, 7, 5, 83–85, 201.1, 206.1; 417/423.4; 422/186, 186.03, 186.04, 900, 422/906, 168–183
  See application file for complete search history.

(56) References Cited

U.S. PATENT DOCUMENTS

| | | | |
|---|---|---|---|
| 5,672,322 A * | 9/1997 | Visser | B01D 53/32 110/345 |
| 2003/0007910 A1* | 1/2003 | Diamant Lazarovich | B01D 53/326 422/186.18 |
| 2004/0081565 A1* | 4/2004 | Kuramoto | F01C 21/007 417/360 |
| 2005/0142000 A1* | 6/2005 | Maquin | B01D 53/38 417/207 |
| 2006/0130649 A1* | 6/2006 | Jain | B01D 53/025 95/82 |
| 2007/0020115 A1* | 1/2007 | Huntley | F04D 19/046 417/199.1 |
| 2008/0289167 A1* | 11/2008 | Chandler | G05B 19/4184 29/428 |
| 2009/0056552 A1 | 3/2009 | Ono et al. | |
| 2010/0178187 A1* | 7/2010 | Okoroafor | F04C 25/02 418/55.2 |
| 2013/0171919 A1* | 7/2013 | Shinohara | B01D 53/005 454/49 |
| 2014/0039655 A1* | 2/2014 | Shelley | G05B 19/41865 700/95 |
| 2014/0112814 A1* | 4/2014 | Kudara | F04C 25/02 418/9 |
| 2014/0294609 A1* | 10/2014 | Palisson | B01D 53/323 417/68 |

FOREIGN PATENT DOCUMENTS

| | | |
|---|---|---|
| EP | 2324902 A1 | 5/2011 |
| FR | 2864913 A1 | 7/2005 |
| GB | 2500610 A | 10/2013 |
| JP | H04-132895 A | 5/1992 |
| JP | 04-290525 | 10/1992 |
| JP | H05-079488 A | 3/1993 |
| JP | H06-047269 A | 2/1994 |
| JP | 06-226032 | 8/1994 |
| JP | H07-506289 A | 7/1995 |
| JP | 09-000861 | 1/1997 |
| JP | H11-005013 A | 1/1999 |

* cited by examiner

VACUUM PUMP WITH ABATEMENT FUNCTION

CROSS REFERENCE TO RELATED APPLICATIONS

This document claims priorities to Japanese Patent Application Number 2014-054128 filed Mar. 17, 2014 and Japanese Patent Application Number 2014-259614 filed Dec. 23, 2014, the entire contents of which are hereby incorporated by reference.

BACKGROUND

In a manufacturing process for manufacturing semiconductor devices, liquid crystal panels, LEDs, solar cells or the like, a process gas is introduced into a process chamber which is being evacuated to perform various processes such as an etching process or a CVD process. The process chamber for performing various processes such as an etching process or a CVD process is evacuated by a vacuum pump. Further, the process chamber and exhaust apparatuses connected to the process chamber are cleaned periodically by supplying a cleaning gas thereto. Because exhaust gases such as the process gas and the cleaning gas contain a silane-based gas ($SiH_4$, TEOS or the like), a halogen-based gas ($ClF_3$, HF, $F_2$, HCl, $Cl_2$ or the like), a PFC gas ($CF_4$, $C_2F_6$, $NF_3$, $SF_6$ or the like) or the like, such exhaust gases have negative effects on human bodies and on the global environment such as global warming. Therefore, it is not preferable that these exhaust gases are emitted to the atmosphere as they are.

Accordingly, these exhaust gases discharged from the process chamber are treated to be made harmless by an exhaust gas treatment apparatus, and the harmless exhaust gases are emitted to the atmosphere. In this case, exhaust systems equipped with the exhaust gas treatment apparatus are classified broadly into a system in which the exhaust gas treatment apparatus is arranged at an immediately downstream side of the process chamber and the vacuum pump is arranged at a downstream side of the exhaust gas treatment apparatus, i.e., a system in which the process chamber, the exhaust gas treatment apparatus, and the vacuum pump are arranged in this order; and a system in which the vacuum pump is arranged at an immediately downstream side of the process chamber and the exhaust gas treatment apparatus is arranged at a downstream side of the vacuum pump, i.e., a system in which the process chamber, the vacuum pump, and the exhaust gas treatment apparatus are arranged in this order. In the vacuum pump, a single vacuum pump may constitute an exhaust system, or a booster pump and a main pump may be connected to constitute an exhaust system.

The above system in which the process chamber, the exhaust gas treatment apparatus, and the vacuum pump are arranged in this order has the following problems: When operation of the exhaust gas treatment apparatus is stopped due to its breakdown or the like, or the operation of the exhaust gas treatment apparatus is stopped even in its normal operation state, products generated by exhaust gas treatment flow back to the process chamber to contaminate the process chamber.

On the other hand, the system in which the process chamber, the vacuum pump, and the exhaust gas treatment apparatus are arranged in this order has no problem that products generated by exhaust gas treatment flow back to the process chamber to contaminate the process chamber, because the vacuum pump is arranged between the process chamber and the exhaust gas treatment apparatus. Therefore, this system is widely used as a stable exhaust system.

However, the above system in which the process chamber, the vacuum pump, and the exhaust gas treatment apparatus are arranged in this order has the following problems: Since a purge gas and a diluent gas are introduced at an upstream side of the exhaust gas treatment apparatus, the exhaust gas treatment apparatus is required to treat the exhaust gas containing the purge gas and the diluent gas, and thus the amount of gas to be treated becomes large and the amount of energy inputted for exhaust gas treatment becomes large.

Conventional exhaust gas treatment apparatuses, including the above two systems, have the following problems.

1) The exhaust gas treatment apparatus is large hi size and needs to be installed fixedly in a factory. Since it is difficult and costly to transport the exhaust gas treatment apparatus that has been installed fixedly, the exhaust gas treatment apparatus has been designed so that maintenance can be performed on site. On the other hand, in order to realize on-site maintenance, component parts such as a motor and a controller are designed to be detachable, and thus the exhaust gas treatment apparatus as a whole becomes expensive and large in size.

2) Since the exhaust gas treatment apparatus is installed fixedly and difficult to be replaced, at the time of breakdown of the apparatus, the process has been forced to be shut down until the completion of repair of the apparatus.

3) Since the exhaust gas treatment apparatus has been designed in accordance with the kind and flow rate of inflow gas, a large amount of work of design, manufacturing, and evaluation has been required.

4) Although the exhaust gas treatment apparatus has a function to treat the introduced gas, such exhaust gas treatment apparatus has not been designed to grasp connection status with another exhaust gas treatment apparatus. Therefore, in order to construct backup, an additional control apparatus for collectively controlling a plurality of exhaust gas treatment apparatuses has been needed.

5) Since the vacuum pump and the exhaust gas treatment apparatus are independent apparatuses and have respective controllers, operational manipulation, daily maintenance, analysis of histories at the time of trouble, and the like of them have been conducted individually, thus requiring troublesome and time-consuming work.

6) in order to avoid deposition of products in the pipe caused by cooling of the gas to be exhausted, the pipe interconnecting the vacuum pump and the exhaust gas treatment apparatus has been heated by using a heater. Thus, initial cost and running cost for the heater have been required. Further, the vacuum pump itself has been equipped with a heater or a thermal insulator to prevent products to be deposited in the pump.

SUMMARY OF THE INVENTION

According to an embodiment, there is provided a vacuum pump with abatement function which can prevent contamination of a process chamber without allowing products generated by exhaust gas treatment to flow back to the process chamber, and can reduce the amount of gas to be treated without allowing a purge gas and a diluent gas to be contained in an exhaust gas, and thus can achieve energy saving by reducing the amount of energy required for the exhaust gas treatment in an abatement part.

Embodiments, which will be described below, relate to a vacuum pump for use in an exhaust system of a manufacturing apparatus for manufacturing semiconductor devices, liquid crystal panels, LEDs, solar cells, or the like, and more particularly to a vacuum pump with abatement function which comprises a vacuum pump, for evacuating a chamber of the manufacturing apparatus, to which an abatement function for treating an exhaust gas discharged from the chamber is added.

In an embodiment, there is provided a vacuum pump with abatement function comprising: a vacuum pump to which at least one abatement part for treating an exhaust gas is attached; wherein the vacuum pump comprises a dry vacuum pump having a pair of multistage pump rotors each of which comprises a plurality of rotors arranged on a rotating shaft; and the at least one abatement part is connected to an interstage of the multistage pump rotors.

The vacuum pump with abatement function according to the above-described embodiment comprises a dry vacuum pump, having a pair of multistage pump rotors, to which the abatement part for treating an exhaust gas to make the exhaust gas harmless is attached. In the above-described embodiment, "treating an exhaust gas to make the exhaust gas harmless" means to perform treatment for reducing a concentration of harmful substances in the exhaust gas. According to the vacuum pump with abatement function of the embodiment, since at least one rotor is provided between a process chamber of a manufacturing apparatus and the abatement part, products generated by exhaust gas treatment do not flow back to the process chamber to contaminate the process chamber. Further, the amount of gas to be treated can be reduced because a purge gas and a diluent gas are not contained in the exhaust gas, and thus the amount of energy required for gas treatment in the abatement part can be reduced to achieve energy saving.

In an embodiment, plural kinds of the abatement parts employing different treatment types of exhaust gas are prepared. Further, a plurality of abatement parts having different treatment amounts of exhaust gas in each of the abatement parts employing different treatment types are prepared. Furthermore, a plurality of abatement parts having different treatment performances of exhaust gas in each of the abatement parts employing different treatment types are prepared. In an embodiment, at least one optimal abatement part is selected, depending on the amount and kind of the exhaust gas discharged from the chamber, from the plural kinds of abatement parts employing different treatment types, and/or the plural abatement parts having different treatment amounts of exhaust gas, and/or the plural abatement parts having different treatment performances of exhaust gas, and the selected abatement part is connected to the interstage of the multistage pump rotors.

In an embodiment, the abatement part comprises a plasma-type abatement part, a dry-type abatement part, a catalytic-type abatement part, or a heater-type abatement part.

Since the abatement part is provided in the interstage of the multistage pump rotors of the dry vacuum pump, the abatement part is required to perform abatement treatment of an exhaust gas under vacuum. Therefore, treatment types of exhaust gas employed in the abatement part include a plasma-type, a heater-type, a dry-type, and a catalytic-type.

In an embodiment, the abatement part connected to the interstage of the multistage pump rotors comprises a plurality of abatement parts which are arranged in series and/or in parallel.

According to the above-described embodiment, the plural abatement parts are arranged in series and/or in parallel to form a group of abatement parts which can cope with various kinds of process demands and complex process demands. The plural abatement parts may be connected in combination of the plural kinds of the abatement parts such as a plasma-type abatement part, a dry-type abatement part, a catalytic-type abatement part, and a heater-type abatement part, or in combination of the plural abatement parts of a single kind, depending on the amount and kinds of the exhaust gas.

In an embodiment, the plurality of the abatement parts are arranged in parallel to have back-up function of the abatement part.

According to the above-described embodiment, by arranging the plurality of abatement parts in parallel, back-up operation can easily be performed. Specifically, at the time of breakdown or maintenance of one abatement part, another abatement part can perform the back-up operation to make the process downtime zero. Since the abatement part is small in size and inexpensive, by installing a plurality of abatement parts for a single process chamber, the back-up function can be provided in a simple way at a low cost. The back-up function may be provided by connecting the same type of abatement parts in parallel, or by connecting the different types of abatement parts in parallel.

In an embodiment, the plurality of abatement parts comprise abatement parts having different treatment types of exhaust gas and/or different treatment amounts of exhaust gas and/or different treatment performances of exhaust gas.

In an embodiment, a controller configured to collectively control the vacuum pump and the abatement part is provided in the vacuum pump.

According to the above-described embodiment, the controller is configured to collectively control the dry vacuum pump and the abatement part so that a portion of signal input/output of the pump is connected to the abatement part, and operation control and status monitoring of the abatement part are performed by the controller. Specifically, the controller is configured to output operation/shutdown signals to the abatement part, and the abatement part is configured to output the status signals of the abatement part to the controller. Since the controller has a display capable of collectively displaying statuses of the dry vacuum pump and the abatement part, a communication port capable of collectively monitoring and/or operating the statuses, and a contact input/output port, connection points are reduced, and thus the operability is improved and the time required for setting up an apparatus can be shortened.

In an embodiment, the vacuum pump comprises a single vacuum pump or a plurality of vacuum pumps connected in series and/or in parallel, and the abatement part is connected to the interstage of the multistage pump rotors of at least one of the vacuum pumps.

In an embodiment, the vacuum pump comprises a gas passage for bypassing the abatement part, so that the abatement part is bypassed to allow only pump function to be used when treatment for making the gas harmless is not required.

According to the above-described embodiment, when treatment for making the exhaust gas harmless is not necessary, the abatement part is bypassed and the operation of the abatement part is stopped to allow only pump function to be used. Thus, energy saving can be achieved.

In an embodiment, an output power of an inverter used for driving the vacuum pump is monitored, and an operational state of the abatement part is changed based on a value of the output power.

The dry vacuum pump is driven by controlling a motor with an inverter. The inverter controls the motor at a rated rotational speed. An output power of the inverter is automatically controlled base on a motor load. Specifically, when the motor load increases, the output power of the inverter is automatically increased to keep an operational rotational speed. On the other hand, as a characteristic of the dry vacuum pump, as the gas flow rate to be sucked increases, the motor load is increased. Although the relationship between the amount of gas and the motor load differs depending on structures of pumps, the motor load varies in accordance with the amount of gas to be sucked in any event. If the relationship between the amount of gas to be sucked, the motor load, and the output power of the inverter is clarified in advance, the amount of gas to be sucked can be estimated from the output power of the inverter. Since the abatement function is not necessary when gas is not sucked, it is estimated whether or not gas flows, and when the gas does not flow, the operation of the abatement part is automatically stopped. Thus, energy saving can be achieved. Further, multilevel settings (e.g., high, medium, low) for the operation intensity of the abatement part are established in accordance with the amount of gas to be sucked which is estimated from the output power of the inverter, and when the amount of gas to be sucked is small according to the monitored output power of the inverter, the abatement part is operated at low intensity, thereby achieving energy saving.

In an embodiment, the vacuum pump is configured such that the pump and the abatement part are in contact with each other, or are integrated.

According to the above-described embodiment, the pump and the abatement part are arranged in contact with each other. Here, "in contact with each other" means that a casing of the pump and a casing of the abatement part are in contact with each other. In this case, a medium having high thermal conductivity such as silicone grease may be applied to a contact surface. Alternatively, boundary parts between the pump and the abatement part may be constructed of a single common wall to thereby integrate the pump and the abatement part.

In an embodiment, the vacuum pump comprises an enclosure configured to house the abatement part, and an exhaust part configured to connect the enclosure to an exhaust duct.

According to the above-described embodiment, since the abatement part is enclosed by the enclosure, and the enclosure is connected to the exhaust duct of a facility where the vacuum pump is installed, a negative pressure is kept in the enclosure itself. Thus, even if a leakage occurs in the abatement part by any chance, a harmful gas can be prevented from flowing out to the outside.

The above-described embodiments offer the following advantages.

1) Since at least one rotor is provided between a process chamber of a manufacturing apparatus and an abatement part, products generated by exhaust gas treatment do not flow back to the process chamber to contaminate the process chamber.

2) The amount of gas to be treated can be reduced because a purge gas and a diluent gas are not contained in the exhaust gas, and thus the amount of energy required for gas treatment in the abatement part can be reduced to achieve energy saving.

3) By combining a dry vacuum pump and a small-sized exhaust gas treatment apparatus, the whole apparatus can be moved easily at the time of maintenance.

4) In case of breakdown, the broken-down pump (with exhaust gas treatment function) is replaced with a back-up pump (with exhaust gas treatment function), and the pump that has been repaired is returned to its original place, and thus the time of process shutdown can be minimized.

5) Since modularized abatement parts are combined in accordance with the kind and amount of gas, an abatement part optimized for various gas conditions can be designed quickly and provided.

6) Even if one of abatement parts which are connected in parallel breaks down, another abatement part can perform exhaust gas treatment, thereby preventing shutdown of a process.

7) Since the vacuum pump with abatement function has a display capable of collectively displaying statuses of the dry vacuum pump and the abatement part, a communication port capable of collectively monitoring and/or operating the statuses, and a contact input/output port, connection points are reduced, and thus the operability is improved and the time required for setting up an apparatus can be shortened.

8) In the case where the vacuum pump is used in a process in which the abatement part is not used or in the case where exhaust gas treatment is not necessary, the abatement part can be bypassed and the operation of the abatement part can be stopped. Thus, the vacuum pump has excellent energy-saving characteristics. Further, the operation status of the abatement part can be changed (stop of operation or change of operation intensity of the abatement part) depending on the amount of gas to be sucked into the dry vacuum pump, and thus the vacuum pump has excellent energy-saving characteristics.

9) Since excellent heat conductivity can be ensured between the dry vacuum pump and the abatement part, compression heat generated by operation of the pump is used for abatement treatment. Further, the pump is heated by heat generated in the abatement part.

10) Since the dry vacuum pump and the abatement part are integrated, a pipe and a heater for heating the pipe are not necessary, and thus the entire system can be provided at a low price.

11) Since the abatement part is enclosed by the enclosure, and the enclosure is connected to the exhaust duct of a facility where the vacuum pump is installed, a negative pressure is kept in the enclosure itself. Thus, even if a leakage occurs in the abatement part by any chance, a harmful gas can be prevented from flowing out.

12) A negative pressure is kept in the abatement part while the dry vacuum pump is being operated. Thus, even if a leakage occurs in the abatement part by any chance, a harmful gas can be prevented from flowing out.

13) Since a gas temperature in the abatement part is high due to the compression heat of the pump, abatement treatment is performed at a high temperature, and thus high abatement efficiency is obtained.

14) Since the abatement part is in a vacuum state, which is a suitable environment for generating plasma, abatement treatment can be performed with a small amount of input energy.

DESCRIPTION OF EMBODIMENTS

Figure 1A:
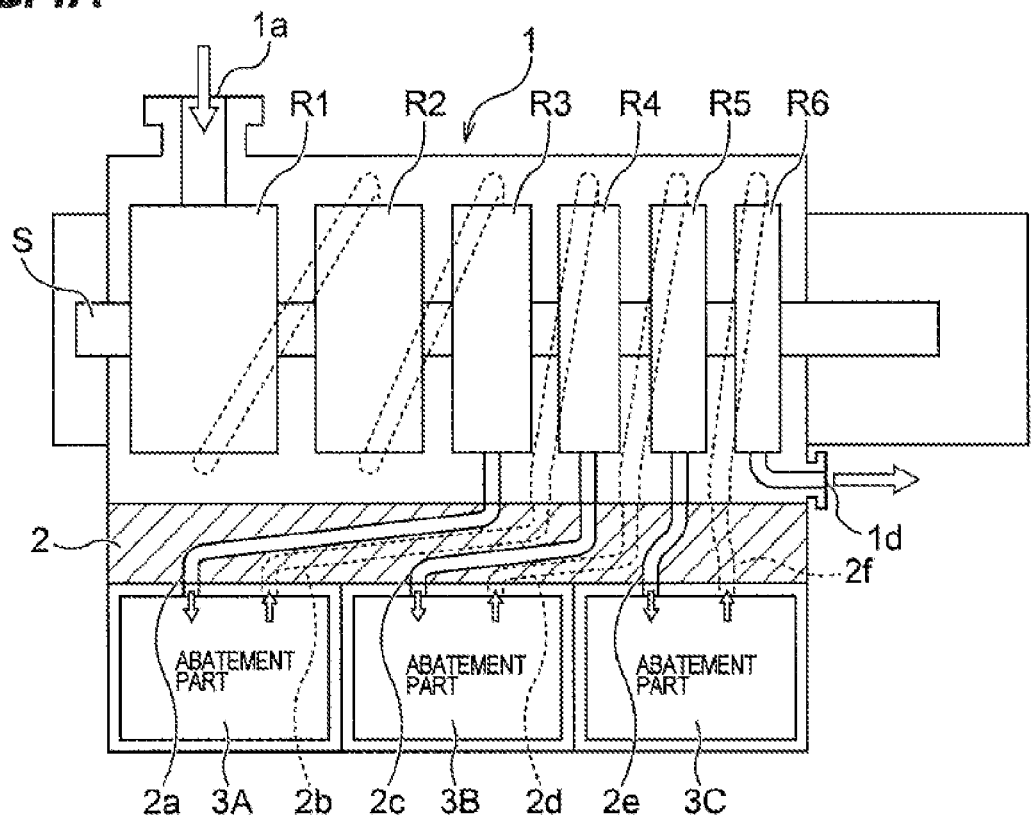
FIGS. 1A and 1B are schematic perspective views showing basic configurations of vacuum pumps with abatement function according to an embodiment.

A vacuum pump with abatement function according to embodiments will be described below with reference to FIGS. 1A through 11. In FIGS. 1A through 11, identical or corresponding parts are denoted by identical or corresponding reference numerals throughout views, and will not be described in duplication.

Figure 1B:
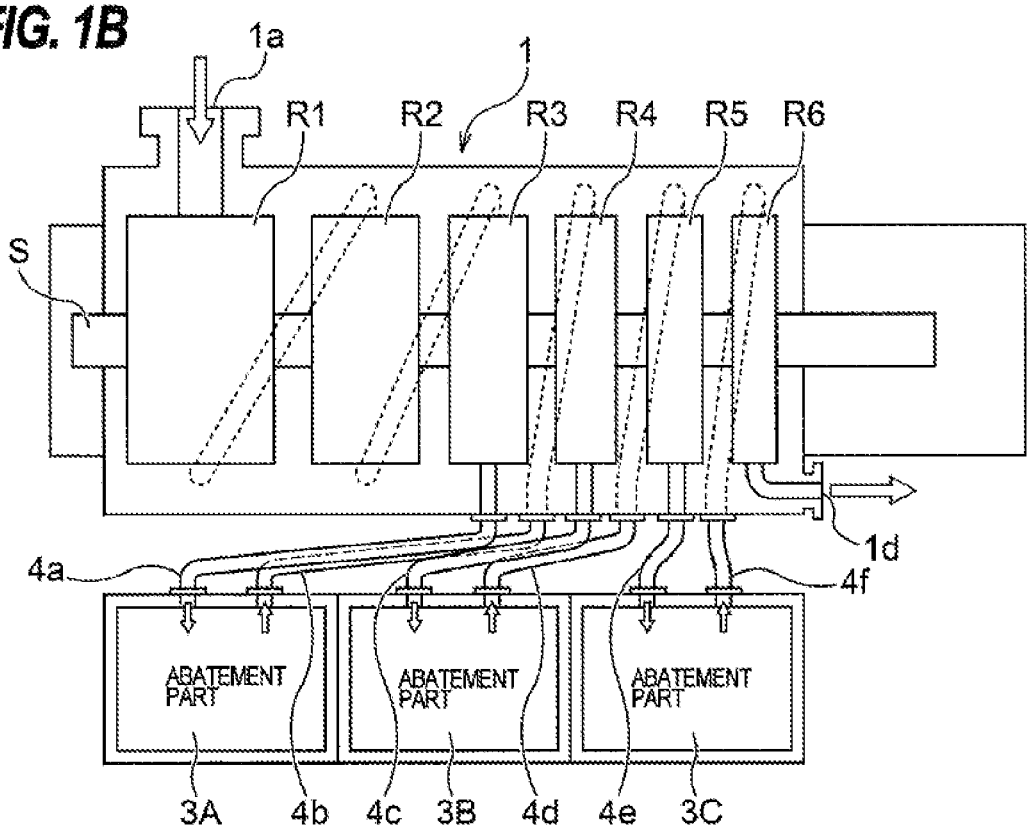

FIGS. 1A and 1B are schematic perspective views showing basic configurations of vacuum pumps with abatement function according to an embodiment.

As shown in FIGS. 1A and 1B, the vacuum pump with abatement function according to the embodiment comprises a multistage roots-type dry vacuum pump 1 having a pair of multistage pump rotors each of which comprises a plurality of rotors R1, R2, R3, R3, R5 and R6 arranged on a rotating shaft S, and at least one of abatement parts 3A, 3B and 3C connected to respective interstages of the multistage pump rotors of the dry vacuum pump 1 (three abatement parts 3A, 3B and 3C are shown in FIGS. 1A and 1B). An inlet port 1a of the dry vacuum pump 1 is connected to a process chamber of a manufacturing apparatus or the like for manufacturing semiconductor devices, liquid crystal panels, LEDs, or the like. A treated gas which has been treated to be made harmless by the abatement parts 3A, 3B, and 3C is exhausted through an outlet port 1d of the dry vacuum pump 1. As long as the dry vacuum pump has a pair of multistage pump rotors, the vacuum pump is not limited to a roots-type vacuum pump, but may be a screw-type, a claw-type, or another type vacuum pump.

In the example shown in FIG. 1A, the interstages of the multistage pump rotors of the dry vacuum pump 1 and the abatement parts 3A, 3B and 3C are interconnected by a connecting block 2. In the connecting block 2, fluid passages 2a to 2f for interconnecting the interstages of the multistage pump rotors of the dry vacuum pump 1 and the abatement parts 3A, 3B and 3C, respectively are formed. Specifically, gas discharged from the third stage rotor R3 is introduced into the abatement part 3A via the fluid passage 2a formed in the connecting block 2, and the gas which has been subjected to abatement treatment in the abatement part 3A is introduced into the fourth stage rotor R4 via the fluid passage 2b formed in the connecting block 2. The same is true for the abatement parts 3B and 3C. Specifically, the gas discharged from the rotor R4 is subjected to abatement treatment in the abatement part 3B and is then introduced into the rotor R5, and the gas discharged from the rotor R5 is subjected to abatement treatment in the abatement part 3C and is then introduced into the rotor R6.

In the example shown in FIG. 1B, the interstages of the multistage pump rotors of the dry vacuum pump 1 and the abatement parts 3A, 3B and 3C are interconnected by connecting pipes 4a to 4f, respectively. Specifically, the gas discharged from the third stage rotor R3 is introduced into the abatement part 3A via the connecting pipe 4a, and the gas which has been subjected to abatement treatment in the abatement part 3A is introduced into the fourth stage rotor R4 via the connecting pipe 4b. The same is true for the abatement parts 3B and 3C.

A booster pump may be disposed at an upstream side of the multistage roots-type dry vacuum pump 1 shown in FIGS. 1A and 1B and an inlet port of the booster pump may be connected to the process chamber. In this case, the multistage roots-type dry vacuum pump 1 serves as a pump for evacuating gas by compressing the gas through several stages from a vacuum to an atmospheric pressure, and the booster pump serves as a pump for boosting (increasing) an evacuation speed of the dry vacuum pump 1.

As shown in FIGS. 1A and 1B, the vacuum pump with abatement function according to the embodiment comprises the multistage roots-type dry vacuum pump 1 to which the abatement parts 3A, 3B and 3C for treating an exhaust gas to make the exhaust gas harmless are attached. According to the vacuum pump with abatement function of the embodiment, since at least one rotor is provided between the process chamber of the manufacturing apparatus and the abatement parts 3A, 3B and 3C, products generated by exhaust gas treatment do not flow back to the process chamber to contaminate the process chamber. Further, the amount of gas to be treated can be reduced because a purge gas and a diluent gas are not contained in the exhaust gas, and thus the amount of energy required for gas treatment in the abatement parts 3A, 3B and 3C can be reduced to thereby achieve energy saving.

According to the embodiment, since the abatement parts 3A, 3B and 3C are provided in the respective interstages of the multistage pump rotors of the dry vacuum pump 1, the abatement parts 3A, 3B and 3C are required to perform abatement treatment of the exhaust gas under vacuum. Therefore, treatment types of exhaust gas employed in the abatement parts 3A, 3B and 3C include a plasma-type, a heater-type, a dry-type, and a catalytic-type.

In an embodiment, these plural kinds of the abatement parts employing different treatment types of exhaust gas are prepared. Further, a plurality of abatement parts having different treatment amounts of exhaust gas in each of the abatement parts employing different treatment types are prepared. Furthermore, a plurality of abatement parts having different treatment performances of exhaust gas in each of the abatement parts employing different treatment types are prepared. In an embodiment, at least one optimal abatement part is selected, depending on the amount and kind of the exhaust gas discharged from the chamber, from the plural kinds of abatement parts employing different treatment types, and/or the plural abatement parts having different treatment amounts of exhaust gas, and/or the plural abatement parts having different treatment performances of exhaust gas, and the selected abatement part is connected to the interstage of the multistage pump rotors.

As shown in FIGS. 1A and 1B, the abatement parts 3A, 3B and 3C are connected respectively to the plural interstages of the multistage pump rotors to form a group of abatement parts which can cope with various kinds of process demands and complex process demands. The plural abatement parts may be connected in combination of the plural kinds of the abatement parts such as a plasma-type abatement part, a dry-type abatement part, a catalytic-type abatement part, and a heater-type abatement part, or in combination of the plural abatement parts of a single kind, depending on the amount and kinds of the exhaust gas.

Next, configurations of the respective abatement parts having different treatment types will be described. In FIGS. 1A and 1B, the plural abatement parts connected to the respective interstages of the multistage pump rotors of the dry vacuum pump 1 are distinguished by reference numerals 3A, 3B and 3C. However, in the following description, if the plural abatement parts are not required to be distinguished from each other, an abatement part 3 or abatement parts 3 will be used.

Figure 2:
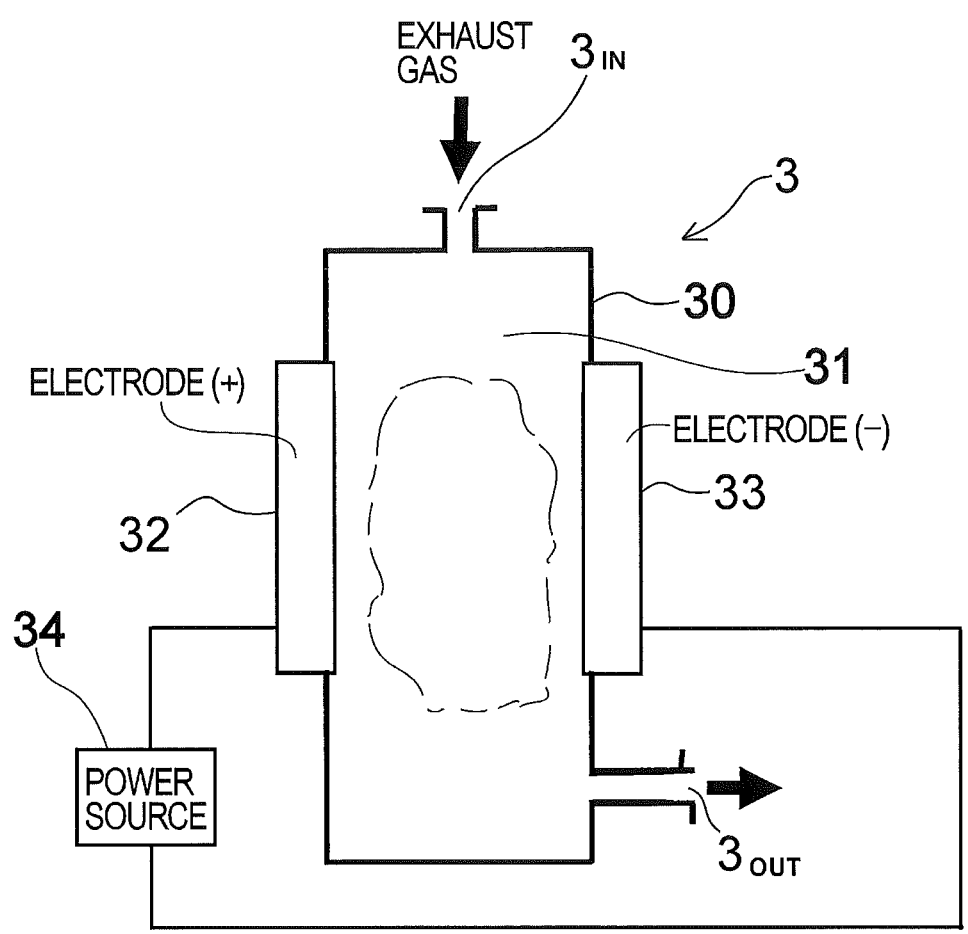
FIG. 2 is a schematic cross-sectional view showing a configuration of a plasma-type abatement part as the abatement part of a vacuum pump with abatement function.

FIG. 2 is a schematic cross-sectional view showing a configuration of a plasma-type abatement part 3 as the abatement part of a vacuum pump with abatement function. As shown in FIG. 2, the plasma-type abatement part 3 comprises a treatment chamber body 30 having a container shape. A treatment chamber 31 is formed in the treatment chamber body 30. In the treatment chamber 31, two electrodes (positive electrode and negative electrode) 32, 33 are disposed so as to face each other with a distance therebetween. A gas introduction port $3_{IN}$ for introducing the exhaust gas to be treated into the treatment chamber is formed at an upper part of the treatment chamber body 30, and a gas outlet $3_{OUT}$ for discharging the gas after treatment is formed at a lower part of the treatment chamber body 30.

As shown in FIG. 2, the exhaust gas discharged from the rotors of the dry vacuum pump 1 is introduced into the treatment chamber 31 from the gas introduction port $3_{IN}$. A high voltage having a high frequency is applied between the two electrodes (positive electrode and negative electrode) 32, 33 by a power source 34 to generate plasma, thereby bombarding molecules of the exhaust gas with electrons, ions and the like at high speeds, so that the exhaust gas is decomposed and treated. The treated gas is discharged from the gas outlet $3_{OUT}$ and is sucked into the subsequent-stage rotors. Since the plasma-type abatement part 3 shown in FIG. 2 is disposed in the interstage of the multistage pump rotors, the abatement part 3 is in a vacuum state, which is a suitable environment for generating plasma, and thus abatement treatment can be performed with a small amount of input energy.

Figure 3:
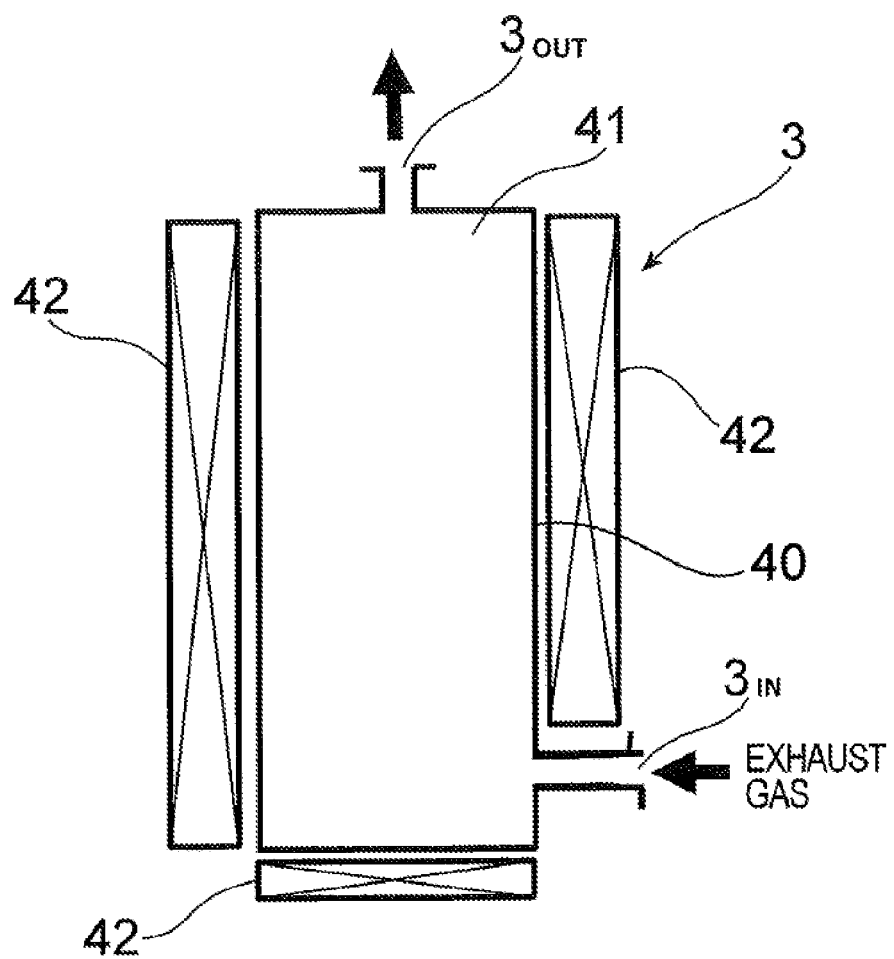
FIG. 3 is a schematic cross-sectional view showing a configuration of a heater-type abatement part as the abatement part of the vacuum pump with abatement function.

FIG. 3 is a schematic cross-sectional view showing a configuration of a heater-type abatement part 3 as the abatement part of the vacuum pump with abatement function. As shown in FIG. 3, the heater-type abatement part 3 comprises a treatment chamber body 40 having a container shape. A treatment chamber 41 is formed in the treatment chamber body 40. Heaters 42 are provided around the outer circumferential portion and at the outer bottom portion, of the treatment chamber body 40. A gas introduction port $3_{IN}$ for introducing the exhaust gas to be treated into the treatment chamber is formed at a lower part of the treatment chamber body 40, and a gas outlet $3_{OUT}$ for discharging the gas after treatment is formed at an upper part of the treatment chamber body 40.

As shown in FIG. 3, the exhaust gas discharged from the rotors of the dry vacuum pump 1 is introduced into the treatment chamber 41 from the gas introduction port $3_{IN}$. The exhaust gas introduced into the treatment chamber 41 is heated by the heaters 42, and decomposed and treated at a high temperature of approximately 500° C. to 900° C., and the treated gas is discharged from the gas outlet $3_{OUT}$ and is sucked into the subsequent-stage rotors.

Figure 4:
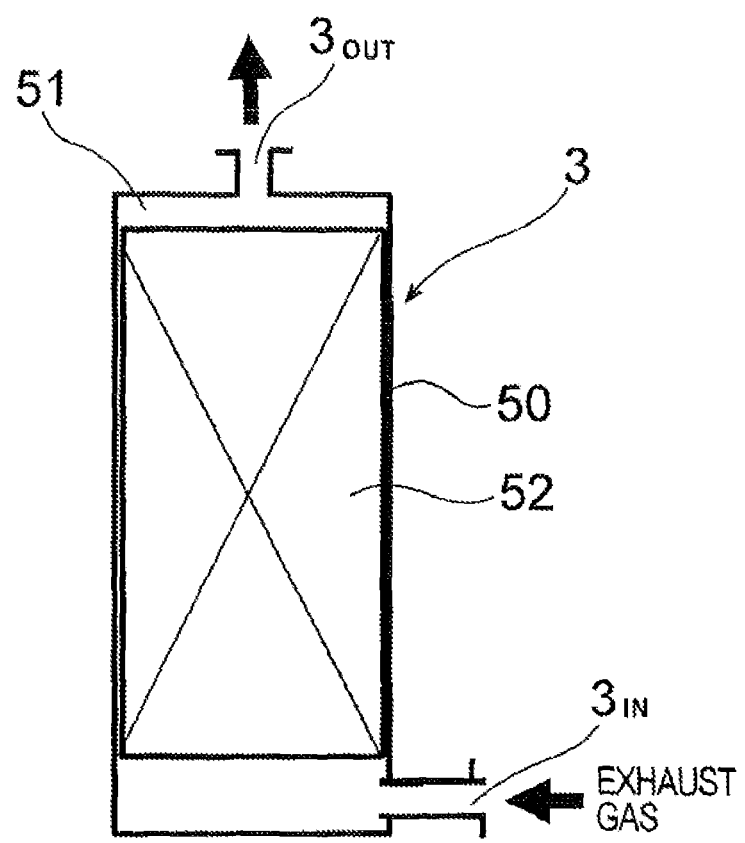
FIG. 4 is a schematic cross-sectional view showing a configuration of a dry-type abatement part as the abatement part of the vacuum pump with abatement function.

FIG. 4 is a schematic cross-sectional view showing a configuration of a dry-type abatement part 3 as the abatement part of the vacuum pump with abatement function. As shown in FIG. 4, the dry-type abatement part 3 comprises a treatment chamber body 50 having a container shape. A treatment chamber 51 is formed in the treatment chamber body 50. A gas introduction port $3_{IN}$ for introducing the exhaust gas to be treated into the treatment chamber is formed at a lower part of the treatment chamber body 50, and a gas outlet $3_{OUT}$ for discharging the gas after treatment is formed at an upper part of the treatment chamber body 50. The treatment chamber 51 is filled with treatment agent (chemical agent) 52 to adsorb the exhaust gas. The treatment agent comprises metal oxides, alkaline agents, noble metal catalysts, or the like. A heater may be provided at an outer wall of the treatment chamber 51 to heat the treatment agent (chemical agent).

As shown in FIG. 4, the exhaust gas discharged from the rotors of the dry vacuum pump 1 is introduced into the treatment chamber 51 from the gas introduction port $3_{IN}$. Harmful components in the exhaust gas introduced into the treatment chamber 51 are adsorbed by the treatment agent 52 and treated, and the treated gas is discharged from the gas outlet $3_{OUT}$ and is sucked into the subsequent-stage rotors.

Figure 5:
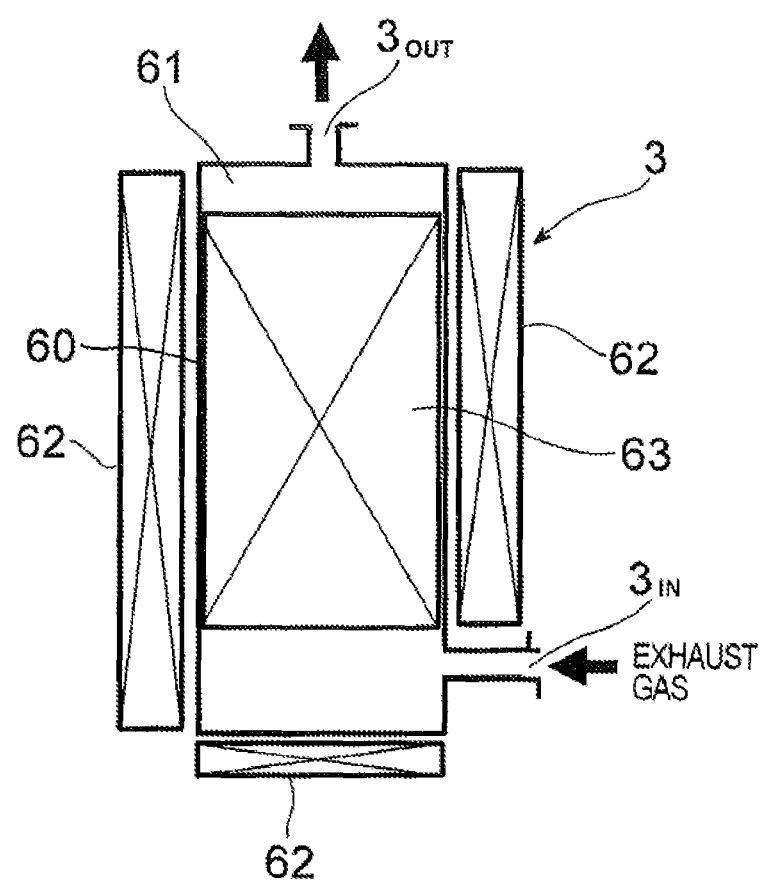
FIG. 5 is a schematic cross-sectional view showing a configuration of a fluorine-fixing-type abatement part, which is one of the catalytic-type abatement parts, as the abatement part of the vacuum pump with abatement function.

FIG. 5 is a schematic cross-sectional view showing a configuration of a fluorine-fixing-type abatement part 3, which is one of the catalytic-type abatement parts, as the abatement part of the vacuum pump with abatement function. As shown in FIG. 5, the fluorine-fixing-type abatement part 3 comprises a treatment chamber body 60 having a container shape. A treatment chamber 61 is formed in the treatment chamber body 60. Heaters 62 are provided around the outer circumferential portion and at the outer bottom portion, of the treatment chamber 61. A gas introduction port $3_{IN}$ for introducing the exhaust gas to be treated into the treatment chamber is formed at a lower part of the treatment chamber body 60, and a gas outlet $3_{OUT}$ for discharging the gas after treatment is formed at an upper part of the treatment chamber body 60.

The treatment Chamber 61 is filled with fixing chemical agent 63 to fix F (fluorine) components. A mixed agent, Which comprises metal components having high decomposition ability of the exhaust gas and metal components for fixing the decomposed F components, is used as the fixing chemical agent. F components contained in PFC gases and in by-product gas, such as $SiF_4$, generated from a process apparatus are fixed to the fixing chemical agent.

As shown in FIG. 5, the exhaust gas discharged from the rotors of the dry vacuum pump 1 is introduced into the treatment chamber 61 from the gas introduction port $3_{IN}$. F components in the exhaust gas introduced into the treatment chamber 61 are fixed to the fixing chemical agent 63, and the treated gas is discharged from the gas outlet $3_{OUT}$ and is sucked into the subsequent-stage rotors.

Figure 6A:
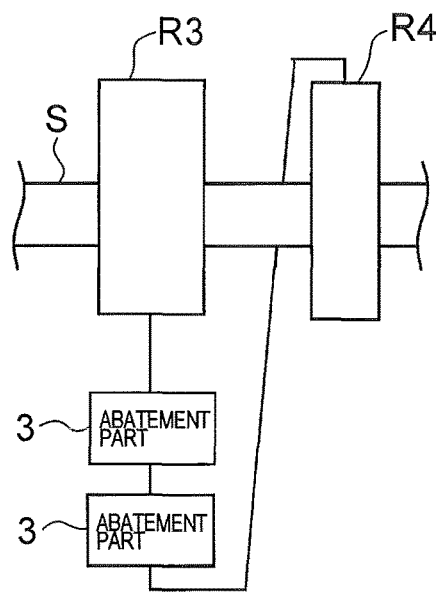
FIGS. 6A, 6B and 6C are schematic views showing examples wherein abatement parts connected to an interstage between plural rotors of the multistage pump rotors of the dry vacuum pump comprise a plurality of abatement parts arranged in series and/or in parallel.
Figure 6B:
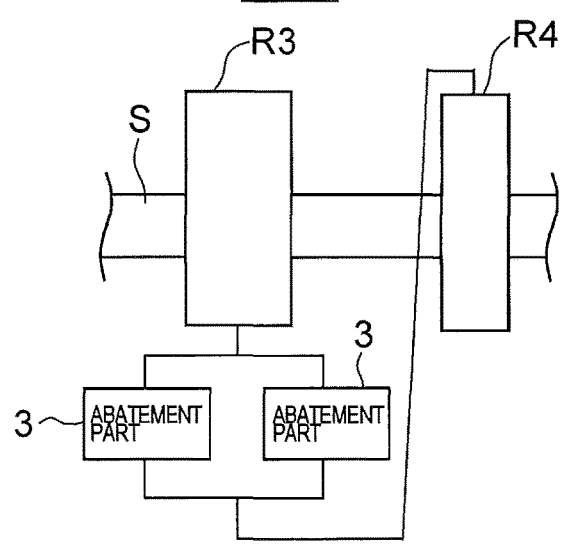
Figure 6C:
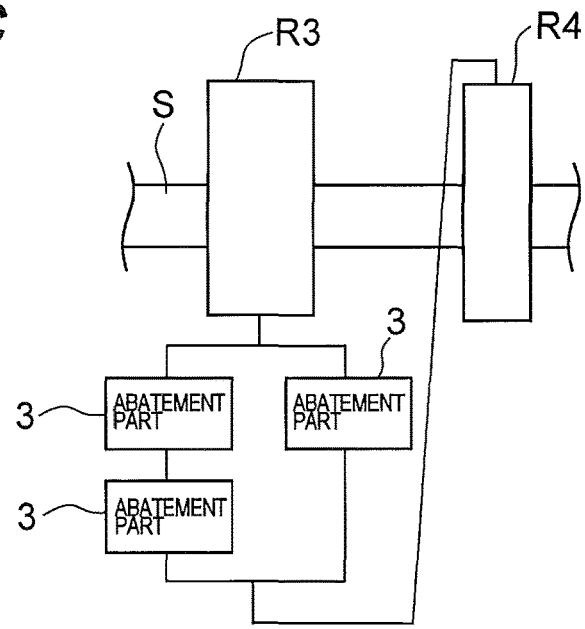

FIGS. 6A, 6B and 6C are schematic views showing examples wherein abatement parts 3 connected to an interstage between plural rotors of the multistage pump rotors of the dry vacuum pump 1 comprise a plurality of abatement parts arranged in series and/or in parallel.

In the example shown in FIG. 6A, the plural two as illustrated) abatement parts 3 are connected in series. The plural abatement parts 3 may be connected via a connecting pipe, or a gas outlet and a gas inlet of the two adjacent abatement parts 3 may be connected directly to each other without using the connecting pipe.

In the example shown in FIG. 6B, the plural (two as illustrated) abatement parts 3 are connected in parallel. The plural abatement parts 3 are connected in parallel via connecting pipes.

In the example shown in FIG. 6C, the plural abatement parts 3 are connected in series and in parallel via connecting pipes. Specifically, the plural (two as illustrated) abatement parts 3 are connected in parallel via connecting pipes, and an abatement part 3 is arranged in one of the connecting pipes so as to form two-stage abatement parts in series.

As shown in FIGS. 6A, 6B and 6C, the plural abatement parts 3 are arranged in series and/or in parallel to form a group of abatement parts which can cope with various kinds of process demands and complex process demands. The plural abatement parts 3 may be connected in combination of the plural kinds of the abatement parts 3 such as a plasma-type abatement part, a dry-type abatement part, a catalytic-type abatement part, and a heater-type abatement part, or in combination of the plural abatement parts 3 of a single kind, depending on the amount and kinds of the exhaust gas.

As shown in FIGS. 6B and 6C, by arranging the abatement parts 3 in parallel, back-up operation can easily be performed. Specifically, at the time of breakdown or maintenance of one abatement part 3, another abatement part 3 can perform the back-up operation to make the process downtime zero.

Since the abatement part is small in size and inexpensive, by installing a plurality of abatement parts for a single process chamber, the back-up function can be provided in a simple way at a low cost. The back-up function may be provided by connecting the same type of abatement parts in parallel, or by connecting the different types of abatement parts in parallel.

Since the abatement part does not require to be installed fixedly on a base or a floor, the abatement part can be easily replaced with a normal product. If replacement of the abatement part is needed, a line is bypassed to the back-up abatement part, and the abatement part to be replaced is removed by means of a clamp coupling or the like. Thus, the abatement part can be replaced without shutdown of the process operation. Therefore, an interruption of the process operation for the maintenance of the abatement part can be avoided.

The design of the abatement part 3 itself is unnecessary or minimized, and only the layout consideration is sufficient. Further, since the abatement parts 3 are standardized for each level of required performance, modification parts can be manufactured easily. Furthermore, the delivery time for the parts can be reduced and the modification procedure can be simplified.

Since every abatement part is designed to meet the standards, in the case of new required specifications, the consideration and acquisition of certification for the standards is not necessary. If necessary, a valve may be provided in the connecting pipe. In the case where the plural abatement parts 3 are connected in series and/or in parallel, the installation place and direction of the abatement parts 3 can be set freely.

Conventionally, in the case of the dry-type abatement apparatuses, filler compositions of chemical agents for the dry-type columns have been changed depending on respective processes. Therefore, in order to achieve the optimization of exhaust gas treatment, a large variety of dry-type columns have needed to be prepared. In addition, the changes of filler compositions have needed to bring back the dry-type columns to the factory each time, and to replace the chemical agents therein.

On the other hand, as shown in FIGS. 6A, 6B and 6C, by arranging the plural abatement parts 3 in series and/or in parallel, the preceding and/or subsequent abatement parts of the plural abatement parts can be easily replaced with an abatement part (parts) filled with other kind (kinds) of chemical agent, and thus the optimization of exhaust gas treatment to exhaust gases generated from different processes can be achieved.

Further, by replacing the abatement part on site, the compositions of the chemical agent can be changed quickly. By changing the kind of chemical agent, a noble gas may be purified and recycled. Further, Pd catalyst is used for $H_2$ treatment to generate heat, which can be reused, for example, to heat $N_2$ gas for the vacuum pump.

Conventionally, in the ease of the heater-type abatement apparatuses, abatement apparatuses having different heater capacities with respect to respective gas flow rates to be introduced have needed to be prepared:

On the other hand, since the plural abatement parts 3 are arranged in series and/or in parallel as shown in FIGS. 6A, 6B and 6C, if plural kinds of heater-type abatement parts having respectively different heater capacities are prepared and arranged depending on a gas flow rate to be introduced, in series, in parallel or in combination thereof, the abatement part does not need to be designed to have excessive heater capacity, but the optimal abatement pan which fits with the gas flow rate to be introduced can be provided at a low cost.

Further, by providing the catalytic-type abatement part at a downstream, side of the heater-type abatement part, treatment of PFC gases and fluorine-fixing can be performed. Furthermore, heat generated in the heater-type abatement part can be reused, for example, to heat $N_2$ gas for the vacuum pump.

Figure 7:
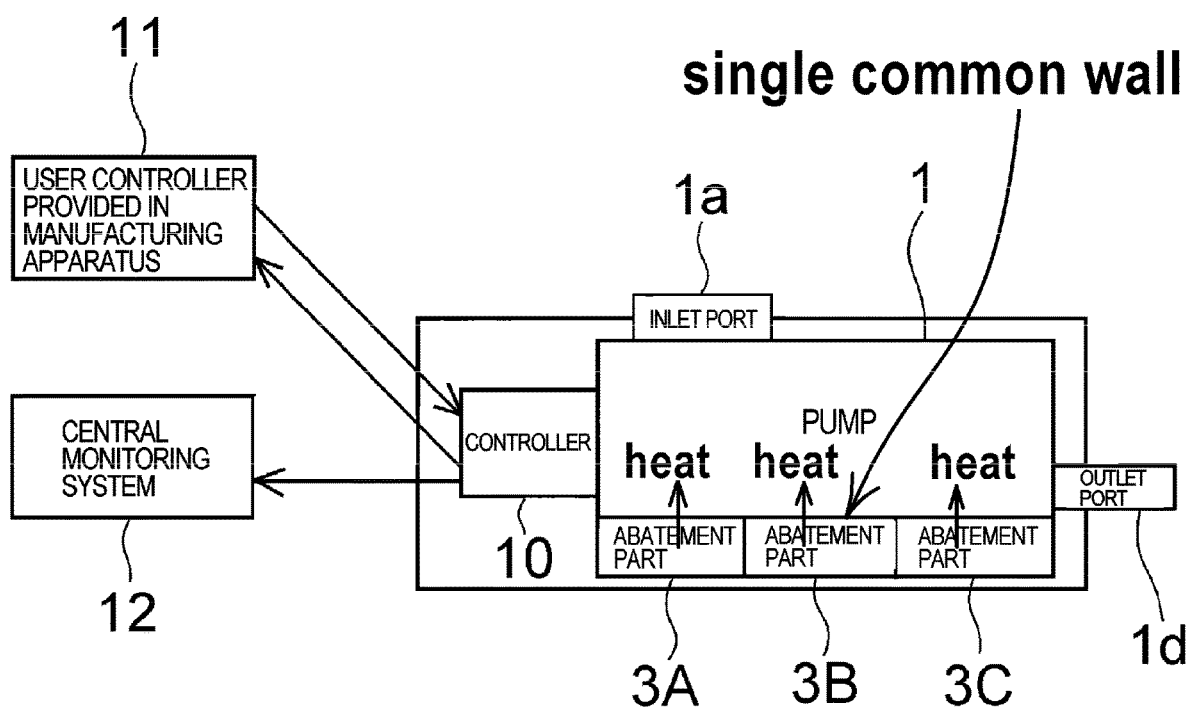
FIG. 7 is a schematic view showing an overall arrangement configuration of the vacuum pump with abatement function.

FIG. 7 is a schematic view showing an overall arrangement configuration of the vacuum pump with abatement function. As shown in FIG. 7, the dry vacuum pump 1 and the abatement parts 3A, 3B and 3C are arranged in contact with each other. Here, "in contact with each other" means that a casing, of the dry vacuum pump 1 and casings of the abatement parts 3A, 3B and 3C are in contact with each other. In this case, a medium having high thermal conductivity such as silicone grease is applied to a contact surface. Alternatively, boundary parts between the dry vacuum pump 1 and the abatement parts 3A, 3B and 3C may be constructed of a single common wall to thereby integrate the dry vacuum, pump 1 and the abatement parts 3A, 3B and 3C. In the following description, the abatement parts 3A, 3B and 3C are not necessary to be distinguished from each other, and thus will be described as the abatement part 3.

As shown in FIG. 7, according to the embodiment, the dry vacuum pump 1 and the abatement part 3 are in contact with each other, or are integrated. Therefore, the following advantages can be obtained.

1) Since excellent heat conductivity can be ensured between the dry vacuum pump 1 and the abatement part 3, compression heat generated by operation of the pump is used for abatement treatment. Further, the pump is heated by heat generated in the abatement part 3.

2) Since the dry vacuum pump 1 and the abatement part 3 are integrated, a pipe and a heater for heating the pipe are not necessary, and thus the entire system can be provided at a low price.

Further, as shown in FIG. 7, a controller 10 is attached to the dry vacuum pump 1. The controller 10 is configured to collectively control the dry vacuum pump 1 and the abatement part 3 so that a portion of signal input/output of the pump is connected to the abatement part 3, and operation control and status monitoring of the abatement part 3 are performed by the controller 10. Specifically, the controller 10 is configured to output operation/shutdown signals to the abatement part 3, and the abatement part 3 is configured to output the status signals of the abatement part 3 to the controller 10. The controller 10 is capable of sending and receiving signals, via communication lines and the like, to and from a user controller 11 provided in a manufacturing apparatus or the like. Further, the controller 10 outputs status signals of the dry vacuum pump 1 and the abatement part 3 to a central monitoring system 12.

When an operation signal of the dry vacuum pump 1 is outputted from the controller 10, an operation signal of the abatement part 3 is outputted simultaneously from the controller 10 to the abatement part 3, thereby starting the operation of the abatement part 3. While the dry vacuum pump 1 is in idling operation, the operation of the abatement part 3 is stopped. In the controller 10, setting of operational timing of the abatement part 3 can be changed. The pump can be operated by a remote operation, local operation and COM operation. Since a main breaker is provided in the controller 10, only the minimum necessary electric components are sufficient for the abatement part 3.

Since the controller 10 is configured to collectively control the dry vacuum pump 1 and the abatement part 3, it is not necessary to prepare interfaces from the manufacturing apparatus respectively for the vacuum pump and for the exhaust gas treatment apparatus unlike conventional manner. Further, the abatement part 3 is comprised of the minimum necessary electric components. Furthermore, since a main port for signals is provided in the vacuum pump, the control of the apparatus side or the factory side can be simplified.

Since the controller 10 controls the abatement part 3 in accordance with the operation status of the dry vacuum pump 1, synchronous operation and safe operation, in accordance with the use conditions and use environment, of the abatement part and the vacuum pump can be realized. The operation mode of the abatement part 3 can be optimized in accordance with the use status of the dry vacuum pump 1.

Since the status of the abatement part 3 is displayed on a status monitoring device of the dry vacuum pump 1, the operation can be performed easily. The collective control can be performed based on only the status displayed on a master vacuum pump, and abnormalities of the abatement part and the pump can be collectively monitored by the user.

Further, since the consolidated information of the dry vacuum pump 1 and the abatement part 3 can be collected, the status of the vacuum pump and the abatement part 3 at the time of trouble can be grasped, and thus the trouble can be analyzed easily and the time necessary for coping with the trouble and the improvement can be shortened.

Although FIG. 7 shows the abatement parts, each of which is connected to the interstage of the multistage pump rotors of the dry vacuum pump 1, the abatement part connected to the interstage of the multistage pump rotors may comprise a plurality of abatement parts 3 arranged in series and/or in parallel as shown in FIGS. 6A, 6B and 6C. In such a case, the plural abatement parts 3 and the controller 10 are connected, and thus the controller 10 can recognize the kinds and the number of the abatement parts 3 automatically. The controller 10 may select the kinds and the number of the abatement parts 3 individually.

Figure 8A:
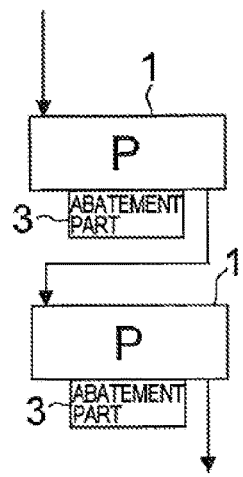
FIGS. 8A, 8B and 8C are schematic views showing examples wherein the vacuum pump comprises a plurality of pumps connected in series and/or in parallel.
Figure 8B:
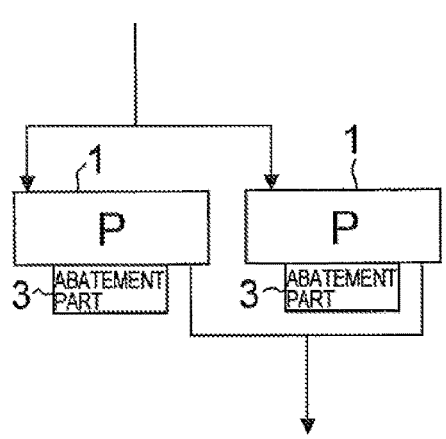
Figure 8C:
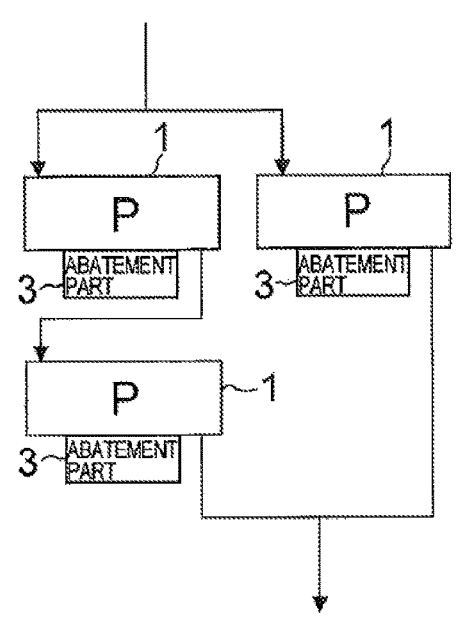

FIGS. 8A, 8B and 8C are schematic views showing examples wherein the vacuum pump comprises a plurality of pumps connected in series and/or in parallel.

In the example shown in FIG. 8A, the plural (two as illustrated) pumps 1 are connected in series. The plural pumps 1 may be connected via a connecting pipe, or an outlet port and an inlet port of the two adjacent pumps 1 may be connected directly to each other without using the connecting pipe.

In the example shown in FIG. 8B, the plural (two as illustrated) pumps 1 are connected in parallel. The plural pumps 1 are connected in parallel via connecting pipes.

In the example shown in FIG. 8C, the plural pumps 1 are connected in series and in parallel via connecting pipes. Specifically, the plural (two as illustrated) pumps 1 are connected in parallel via connecting pipes, and a pump 1 is arranged in one of the connecting pipes so as to form two-stage pumps in series.

Although FIGS. 8A, 8B and 8C show the examples in which the plural pumps 1 are connected in series and/or in parallel and the abatement part 3 is connected to each of the pumps 1, the abatement part 3 may be connected to the interstage of the multistage pump rotors of at least one of the plural pumps 1.

As shown in FIGS. 8B and 8C, in the case where the plural (two as illustrated) pumps 1 are connected in parallel, the plural pumps 1 are operated in parallel. Although a single pump 1 has evacuation performance capable of evacuating a chamber of the manufacturing apparatus, the evacuation time can be shortened by operating two pumps in parallel. Further, even when one pump 1 is stopped due to breakdown or the like, the other pump 1 can continue to operate without any hindrance to a manufacturing process. Furthermore, as shown in FIG. 8A, the pumps 1 are connected in series to increase the evacuable gas flow rate. Further, the energy for decomposing the exhaust gas can be inputted in two stages, and thus the treatment efficiency of a persistent gas can be improved.

Figure 9:
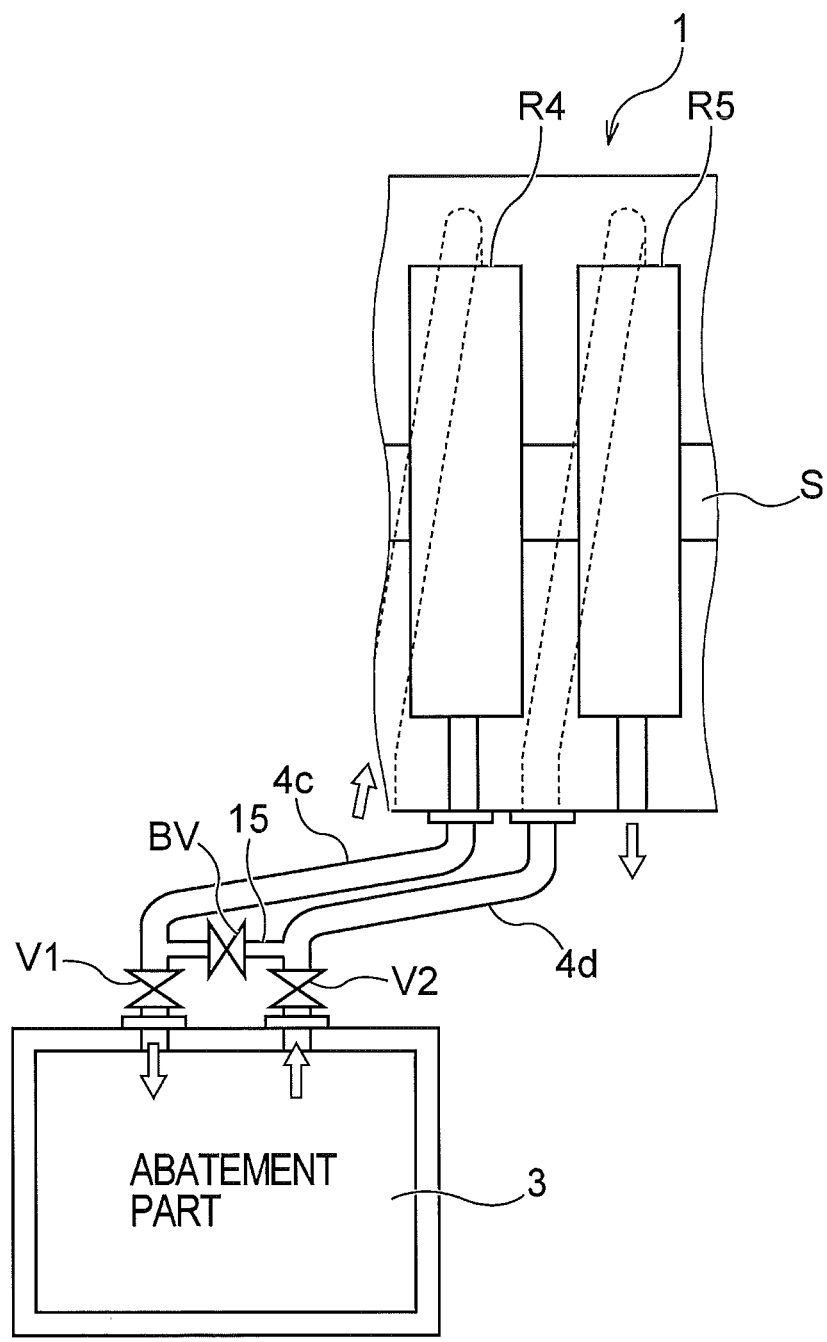
FIG. 9 is a schematic view showing a configuration which has a bypass passage for bypassing the abatement part connected to the interstage of the multistage pump rotors of the dry vacuum pump.

FIG. 9 is a schematic view showing a configuration which has a bypass passage for bypassing the abatement part 3 connected to the interstage of the multistage pump rotors of the dry vacuum pump 1. As shown in FIG. 9, a bypass passage 15 is provided between connecting pipes 4c, 4d interconnecting the abatement part 3 and the interstage of the multistage pump rotors of the pump 1, and a bypass valve BV is provided in the bypass passage 15. Further, valves V1, V2 are provided in the connecting pipes 4c, 4d interconnecting the interstage of the multistage pump rotors and the abatement part 3.

According to the configuration shown in FIG. 9, when treatment for making the exhaust gas harmless is not necessary, the valves V1, V2 are closed and the bypass valve BV is opened. Thus, the abatement part 3 is bypassed and the operation of the abatement part 3 is stopped to allow only pump function to be used. Therefore, energy saving can be achieved.

Next, a control method in the case where the operation status of the abatement part 3 is changed during the operation of the dry vacuum pump 1 will be described.

The dry vacuum pump is driven by controlling a motor with an inverter. The inverter controls the motor at a rated rotational speed. An output power of the inverter is automatically controlled base on a motor load. Specifically, when the motor load increases, the output power of the inverter is automatically increased to keep an operational rotational speed. On the other hand, as a characteristic of the dry vacuum pump, as the gas flow rate to be sucked increases, the motor load is increased. Although the relationship between the amount of gas and the motor load differs depending on structures of pumps, the motor load varies in accordance with the amount of gas to be sucked in any event.

If the relationship between the amount of gas to be sucked, the motor load, and the output power of the inverter is clarified in advance, the amount of gas to be sucked can be estimated from the output power of the inverter. Since the abatement function is not necessary when gas is not sucked, it is estimated whether or not gas flows, and when the gas does not flow, the operation of the abatement part is automatically stopped. Thus, energy saving can be achieved.

Next, a specific control method will be described. The output power of the inverter used for driving the dry vacuum pump 1 is monitored, and when the output power exceeds a threshold A or becomes lower than the threshold A, the operation of the abatement part 3 is stopped. When the output power becomes lower than a threshold B or exceeds the threshold B, the operation of the abatement part 3 is restarted. When the operation of the abatement part 3 is stopped, in FIG. 9, the valves V1, V2 are closed and the bypass valve BV is opened to allow the gas to flow through the bypass passage 15.

Although ON/OFF control of the abatement part 3 is performed in the above control method, the abatement part 3 can be controlled so as to change operation intensity. Specifically, multilevel settings (e.g., high, medium, low) for the operation intensity of the abatement part are established in accordance with the amount of gas to be sucked which is estimated from the output power of the inverter, and when the amount of gas to be sucked is small according to the monitored output power of the inverter, the abatement part 3 is operated at low intensity, thereby achieving energy saving.

Figure 10:
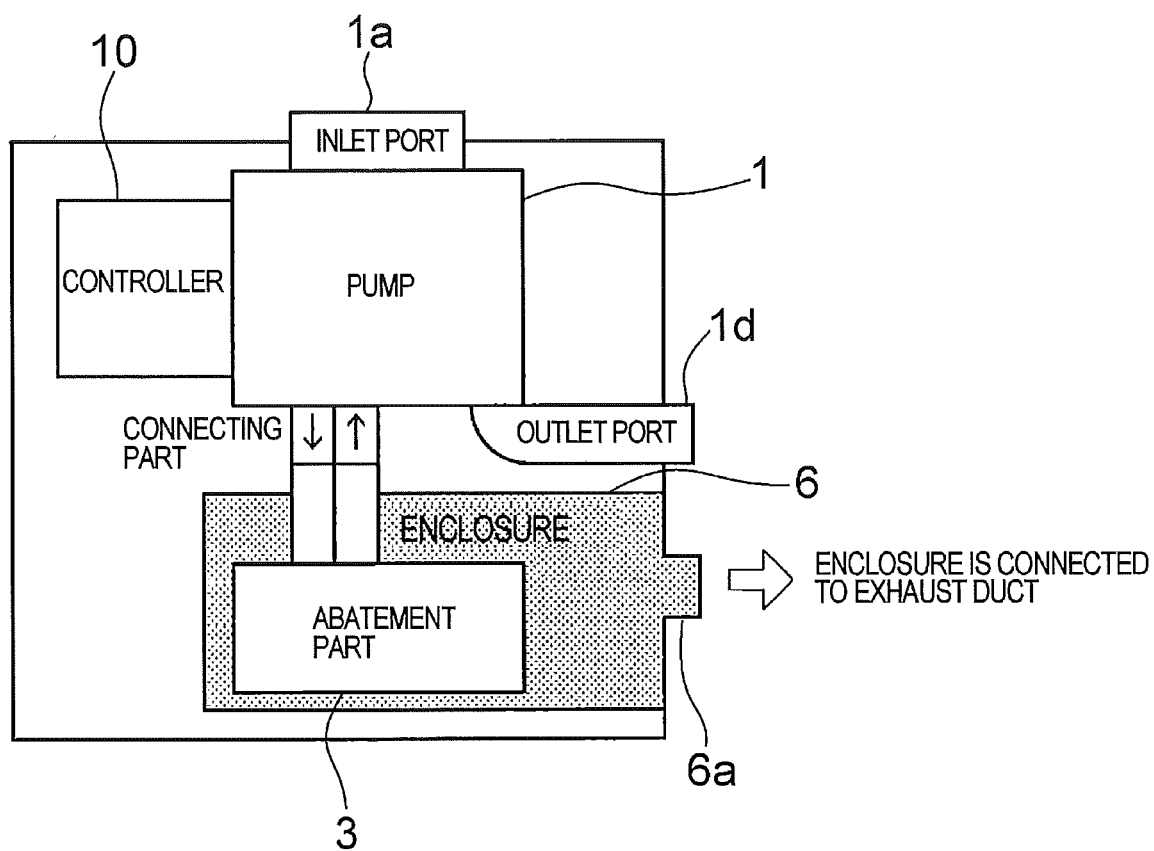
FIG. 10 is a schematic view showing a configuration having an enclosure which houses the abatement part.

FIG. 10 is a schematic view showing a configuration having an enclosure which houses the abatement part 3. As shown in FIG. 10, the dry vacuum pump 1 and the abatement part 3 are connected via a connecting part. The abatement part 3 is housed by an enclosure 6. The enclosure 6 is an airtight structure and has an exhaust part 6a for connecting the enclosure 6 to an exhaust duct. As shown in FIG. 10, since the abatement part 3 is enclosed by the enclosure 6 and the enclosure 6 is connected to the exhaust duct of a facility where the vacuum pump is installed, a negative pressure is kept in the enclosure itself. Thus, even if a leakage occurs in the abatement part 3 by any chance, a harmful gas can be prevented from flowing out to the outside.

Figure 11:
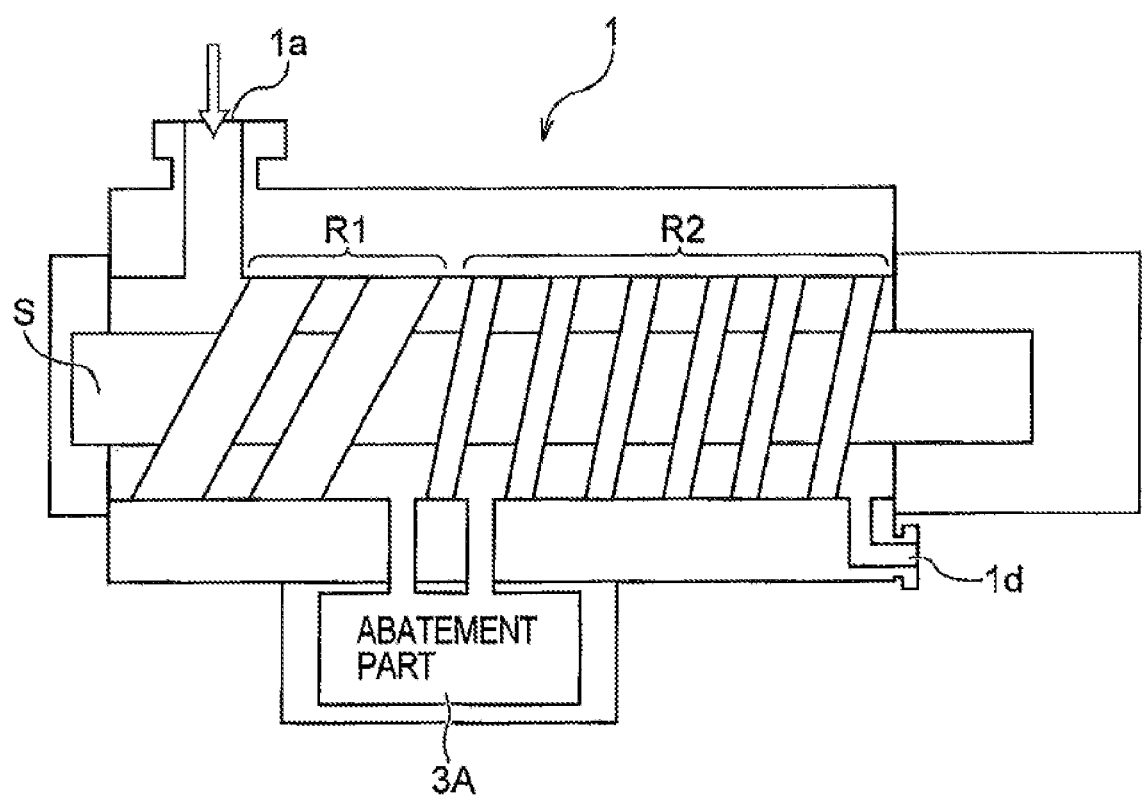
FIG. 11 is a schematic view showing an embodiment of a vacuum pump with abatement function which comprises a multistage screw-type dry vacuum pump to which an abatement part is attached.

FIG. 11 is a schematic view showing an embodiment of a vacuum pump with abatement function which comprises a multistage screw-type dry vacuum pump to which an abatement part is attached.

In the example shown in FIG. 11, a two-stage screw-type dry vacuum pump 1 is used, and an abatement part 3A is provided in an interstage between two-stage screw rotors R1, R2, i.e., between the last turn of the first-stage screw rotor R1 and the first turn of the second-stage screw rotor R2. Other structures are the same as those of the vacuum pump with abatement function shown in FIGS. 1A and 1B.

The screw-type dry vacuum pump shown in FIG. 11 can offer the same effects as those of the vacuum pump with abatement function shown in FIGS. 1A and 1B. If the number of compression stages of the screws is increased, other abatement parts such as abatement parts 3B, 3C can be provided as shown in FIGS. 1A and 1B. The configurations shown in FIGS. 2 through 10 can be applied to the multistage screw-type dry vacuum pump 1 shown in FIG. 11.

Although the embodiments of the present invention have been described above, it should be understood that the present invention is not limited to the above embodiments, but various changes and modifications may be made to the embodiments without departing from the scope of the appended claims.

What is claimed is:

1. A vacuum pump with abatement function comprising:
a dry vacuum pump having a pair of multistage pump rotors each of which comprises a plurality of rotors arranged on a rotating shaft; and
a plurality of abatement parts for treating an exhaust gas integrated with the dry vacuum pump via a single common wall;
wherein the vacuum pump with abatement function is configured such that the dry vacuum pump and the plurality of abatement parts are integrated by allowing boundary parts between the dry vacuum pump and the plurality of abatement parts to be constructed of the single common wall, heat conductivity between the dry vacuum pump and the plurality of abatement parts being ensured by the single common wall between the dry vacuum pump and the plurality of abatement parts;
wherein heat generated in the plurality of abatement parts heats the vacuum pump by said heat conductivity; and
wherein one of the plurality of abatement parts comprises plural abatement parts which are arranged in parallel to have a back-up function among the plural abatement parts.

2. The vacuum pump with abatement function according to claim 1, wherein the plurality of abatement parts comprise a plasma-type abatement part, a dry-type abatement part, a catalytic-type abatement part, or a heater-type abatement part.

3. The vacuum pump with abatement function according to claim 1, wherein the vacuum pump with abatement function comprises an enclosure configured to house the plurality of abatement parts, and an exhaust part configured to connect the enclosure to an exhaust duct.

4. The vacuum pump with abatement function according to claim 1, wherein the single common wall comprises a connecting block.

5. The vacuum pump with abatement function according to claim 1, wherein the plurality of abatement parts comprise abatement parts having different treatment types of exhaust gas and/or different treatment amounts of exhaust gas and/or different treatment performances of exhaust gas.

6. The vacuum pump with abatement function according to claim 1, wherein a controller configured to collectively control the dry vacuum pump and the plurality of abatement parts is provided in the vacuum pump with abatement function.

7. The vacuum pump with abatement function according to claim 1, wherein the dry vacuum pump comprises a single dry vacuum pump or a plurality of dry vacuum pumps connected in series and/or in parallel, and the plurality of abatement parts are connected to the interstages of the multistage pump rotors of at least one of the dry vacuum pumps.

8. The vacuum pump with abatement function according to claim 1, wherein an output power of an inverter used for driving the dry vacuum pump is monitored, and an operational state of the plurality of abatement parts is changed based on a value of the output power.

9. A vacuum pump with abatement function comprising:
a dry vacuum pump having a pair of multistage pump rotors each of which comprises a plurality of rotors arranged on a rotating shaft; and
a plurality of abatement parts for making an exhaust gas harmless, the plurality of abatement parts integrated with the dry vacuum pump via a single common wall;
wherein the vacuum pump with abatement function is configured such that the dry vacuum pump and the plurality of abatement parts are integrated by allowing boundary parts between the dry vacuum pump and the plurality of abatement parts to be constructed of the single common wall, heat conductivity between the dry vacuum pump and the plurality of abatement parts being ensured by the single common wall between the dry vacuum pump and the plurality of abatement parts; and
wherein one of the plurality of abatement parts comprises plural abatement parts which are arranged in parallel to have a back-up function among the plural abatement parts.

10. The vacuum pump with abatement function according to claim 9, wherein the dry vacuum pump comprises a single dry vacuum pump or a plurality of dry vacuum pumps connected in series and/or in parallel, and the plurality of abatement parts are connected to the interstages of the multistage pump rotors of at least one of the dry vacuum pumps.

11. The vacuum pump with abatement function according to claim 9, wherein an output power of an inverter used for driving the dry vacuum pump is monitored, and an operational state of the plurality of abatement parts is changed based on a value of the output power.

12. The vacuum pump with abatement function according to claim 9, wherein the vacuum pump with abatement function comprises an enclosure configured to house the plurality of abatement parts, and an exhaust part configured to connect the enclosure to an exhaust duct.

13. The vacuum pump with abatement function according to claim 9, wherein the single common wall comprises a connecting block.

14. The vacuum pump with abatement function according to claim 9, wherein the plurality of abatement parts comprise a plasma-type abatement part, a dry-type abatement part, a catalytic-type abatement part, or a heater-type abatement part.

15. The vacuum pump with abatement function according to claim 9, wherein the plurality of abatement parts comprise abatement parts having different treatment types of exhaust gas and/or different treatment amounts of exhaust gas and/or different treatment performances of exhaust gas.

16. The vacuum pump with abatement function according to claim 9, wherein a controller configured to collectively control the dry vacuum pump and the plurality of abatement parts is provided in the vacuum pump with abatement function.

* * * * *